United States Patent
Maeda et al.

(10) Patent No.: US 7,888,187 B2
(45) Date of Patent: Feb. 15, 2011

(54) ELEMENT MOUNTING SUBSTRATE AND METHOD FOR MANUFACTURING SAME

(75) Inventors: Masakatsu Maeda, Shunan (JP);
Yasuyuki Yamamoto, Shunan (JP);
Kunihiro Gotoh, Shunan (JP)

(73) Assignee: Tokuyama Corporation (JP)

( * ) Notice: Subject to any disclaimer, the term of this patent is extended or adjusted under 35 U.S.C. 154(b) by 936 days.

(21) Appl. No.: 11/791,595

(22) PCT Filed: Nov. 18, 2005

(86) PCT No.: PCT/JP2005/021298
§ 371 (c)(1),
(2), (4) Date: May 24, 2007

(87) PCT Pub. No.: WO2006/057205
PCT Pub. Date: Jun. 1, 2006

(65) Prior Publication Data
US 2008/0145518 A1 Jun. 19, 2008

(30) Foreign Application Priority Data
Nov. 25, 2004 (JP) .............................. 2004-340773

(51) Int. Cl.
*H01L 21/50* (2006.01)
*H01L 23/06* (2006.01)
(52) U.S. Cl. ...................... 438/125; 257/703
(58) Field of Classification Search ......... 438/125–127, 438/667; 257/701–705
See application file for complete search history.

(56) References Cited
U.S. PATENT DOCUMENTS
6,087,923 A * 7/2000 Ahn et al. .................... 338/21
2009/0027157 A1 * 1/2009 Katsumura et al. ............ 338/21

FOREIGN PATENT DOCUMENTS

| JP | 04-137752 A | 5/1992 |
|----|-------------|--------|
| JP | 05-129275 | 5/1993 |
| JP | 07-074279 | 3/1995 |
| JP | 8239286 | 9/1996 |
| JP | 09-036274 | 2/1997 |
| JP | 09-275166 | 10/1997 |
| JP | 2000323619 A | 11/2000 |
| JP | 2003218518 A | 7/2003 |
| JP | 2003-347462 | 12/2003 |
| JP | 2005-340562 A | 12/2005 |

* cited by examiner

*Primary Examiner*—Calvin Lee
(74) *Attorney, Agent, or Firm*—The Webb Law Firm (57) ABSTRACT

An element-mounting substrate includes a ceramic substrate, an electrode layer formed on the substrate and a ceramic coating layer which is formed on a part of the electrode layer and has a thickness of 5 to 50 μm. A process for producing the element-mounting substrate includes the steps of forming an electrode precursor layer in the shape of a pattern of an electrode layer on a ceramic plate or a green sheet of a large diameter, forming a ceramic coating precursor layer on a part of the electrode precursor layer and then firing the resulting precursor. In this process, it is preferable to form the ceramic coating layer so as to cover the electrode layer on a predetermined cutting line of the firing product. According to the element-mounting substrate in which a part of the electrode layer is covered with a ceramic, a failure in mounting an element attributable to the thickness of the ceramic coating layer can be prevented when the element is mounted. In addition, peeling or cracking of the electrode layer caused by impact during dicing can be prevented.

7 Claims, 5 Drawing Sheets

ELEMENT MOUNTING SUBSTRATE AND METHOD FOR MANUFACTURING SAME

TECHNICAL FIELD

The present invention relates to an element-mounting substrate which is preferable for producing light emitting devices or the like and a process for producing the substrate.

BACKGROUND ART

Working of light emitting elements such as light emitting diode is accompanied by heat generation, so that such elements are mounted on element-mounting substrates composed of ceramic materials of high thermal conductivity, such as aluminum nitride. By the use of such element-mounting substrates, heat generated in the working is rapidly dissipated, and the action is stabilized.

Such an element-mounting substrate is produced by dicing a large-diameter ceramic plate having a metallization layer (electrode layer, wiring pattern or the like) into a given size (patent document 1). On the metallization layer, a plating layer for mounting an element is usually formed.

Dicing of the ceramic plate having the metallization layer formed thereon is carried out by a rotary round blade that is called a dicing blade.

Patent document 1: Japanese Patent Laid-Open Publication N. 239286/1996

DISCLOSURE OF THE INVENTION

Problem to be Solved by the Invention

In the field of element-mounting substrates, fining of wiring patterns has been recently required with miniaturization and enhancement of performance of elements, and besides, reduction of production cost has been also required. To meet such requirements, it is necessary to form fine patterns using metallization technique of low cost. For forming fine patterns, a so-called thin film process, such as sputtering or vacuum deposition, is frequently adopted. In the thin film process, however, the production cost is high, so that from the viewpoint of cost, it is preferable to adopt a thick film process using a high-melting point metal paste capable of forming a metallization layer at a lower cost.

However, it has become clear that in the case where a metallization layer is formed by the thick film process, particularly a thick film process using a paste containing a high-melting point metal such as tungsten or molybdenum, there occurs a problem that the metallization layer slightly peels or cracks at the cut portion when diced. It is thought that in the formation of a metallization layer by the thin film process, such a problem does not occur because the film thickness is small and the metal itself used is relatively soft, but in the formation of a metallization layer by the thick film process, the above problem occurs because the metallization layer has a large thickness of 1 µm to 50 µm and especially in the use of a high-melting point metal, the metal itself is rigid.

The problem of peeling or cracking of the metallization layer does not matter in the uses for which formation of fine patterns is not required, and in such uses, further, it is possible to cut the ceramic plate portion on a surface of which a metallization layer has not been formed because there is a room in the pattern design. In contrast therewith, in order to efficiently produce an element-mounting substrate having a fine wiring pattern, it is preferable to carry out dicing after plating is previously carried out, and when electroplating is adopted as the plating method, all the wiring patterns to be plated needs to be electrically connected to one another. In the case where such a production process is adopted, therefore, cutting of the portion including the metallization layer is inevitable in the dicing. Thus, it can be said that the aforesaid problem is a problem peculiar to the efficient production of an element-mounting substrate having a wiring pattern that is highly precisely formed by a thick film process, particularly a thick film process using a high-melting point metal paste.

As a method to solve the above problem, a method wherein cutting is carried out after a ceramic or a glass that is a rigid material is bonded to a metallization layer with a wax or an adhesive is considered. By adopting such a method, a structure in which the metallization layer is sandwiched between a ceramic and the rigid material is formed, and it is thought that peeling or cracking hardly takes place even if an impact is given in the dicing. If such a method is adopted, however, a step of removing the rigid material by cleaning or the like becomes necessary after dicing, and besides, there occurs another problem that the yield is lowered by the residue in the removal step.

It is also considered to obtain the same effect by further providing a rigid ceramic layer on a plating layer that is formed on the metallization layer, but it is not realistic to form a plating layer and then form a ceramic layer thereon. When the ceramic layer is fired, the plating layer is fused, and therefore, the purpose of the plating layer cannot be attained.

Accordingly, after formation of the matallization layer or simultaneously with formation of the metallization layer, the ceramic layer is fired, and thereafter, the plating layer is formed. Thus, the plating layer is formed on the metallization layer, and as a matter of course, the ceramic layer needs to be formed so that a part of the metallization layer should be exposed. Further, in order to prevent the aforesaid peeling or cracking of the metallization layer in the dicing, the metallization layer on at least the predetermined cutting line needs to be covered with the ceramic layer.

The most familiar means to form such a ceramic layer is to use a green sheet similarly to the production of a ceramic plate.

However, it is extremely troublesome to previously cut the green sheet according to the shape and the size of the desired substrate to give such a shape that a part of the metallization layer is exposed correspondingly to the place where a solder layer is to be formed and the metallization layer on the predetermined cutting line is covered. Moreover, because the green sheet is relatively thick, the firing product thereof also becomes thick (usually about 0.1 to 1 mm). On this account, even if the solder layer is formed, mounting of an element cannot be carried out occasionally because the thickness of the ceramic layer hinders the mounting operation.

SUMMARY OF THE INVENTION

The present invention solves the above-mentioned various problems at the same time, and the gist of the invention is as follows.

(1) An element-mounting substrate comprising a ceramic substrate, an electrode layer formed on the substrate and a ceramic coating layer which is formed on a part of the electrode layer and has a thickness of 1 to 50 µm.

(2) The element-mounting substrate as stated in (1), wherein the ceramic substrate comprises aluminum nitride.

(3) The element-mounting substrate as stated in (1) or (2), wherein the ceramic coating layer comprises aluminum nitride.

(4) The element-mounting substrate as stated in any one of (1) to (3), wherein at the ends of the surface of the element-mounting substrate, the ceramic coating layer is formed so as to cover the electrode layer.

(5) The element-mounting substrate as stated in any one of (1) to (4), wherein on the side surface of the element-mounting substrate, sections of the ceramic substrate, the electrode layer and the ceramic coating layer are exposed on the same plane.

(6) The element-mounting substrate as stated in any one of (1) to (5), wherein on the electrode layer on which the ceramic coating layer is not formed, a solder layer is provided.

(7) A device comprising the element-mounting substrate as stated in (6) and a light emitting element or a driving circuit which is connected to the element-mounting substrate through the solder layer.

(8) A process for producing an element-mounting substrate, comprising a step of forming an electrode precursor layer in the shape of a pattern of an electrode layer on a ceramic plate or a green sheet of a large diameter, a step of forming a ceramic coating precursor layer on a part of the electrode precursor layer, and a step of firing the resulting precursor.

(9) The process for producing an element-mounting substrate as stated in (8), wherein the ceramic coating precursor layer is formed so as to cover the electrode precursor layer on a predetermined cutting line of a laminate, and a step of cutting the firing product along the predetermined cutting line to separate the firing product is further included.

According to the present invention, a ceramic coating layer of a relatively small thickness is formed so as to cover a part of an electrode layer, so that a part of the electrode layer is exposed, and on this exposed portion a solder layer can be provided. Further, when an element is mounted through the solder layer, the thickness of the ceramic coating layer does not hinder the mounting operation.

Furthermore, by forming the ceramic coating layer so as to cover the electrode layer on the predetermined cutting line, peeling or cracking of the electrode layer due to an impact given in the dicing can be prevented.

BEST MODE FOR CARRYING OUT THE INVENTION

The present invention is described in detail hereinafter with reference to the attached drawings.

Figure 1:
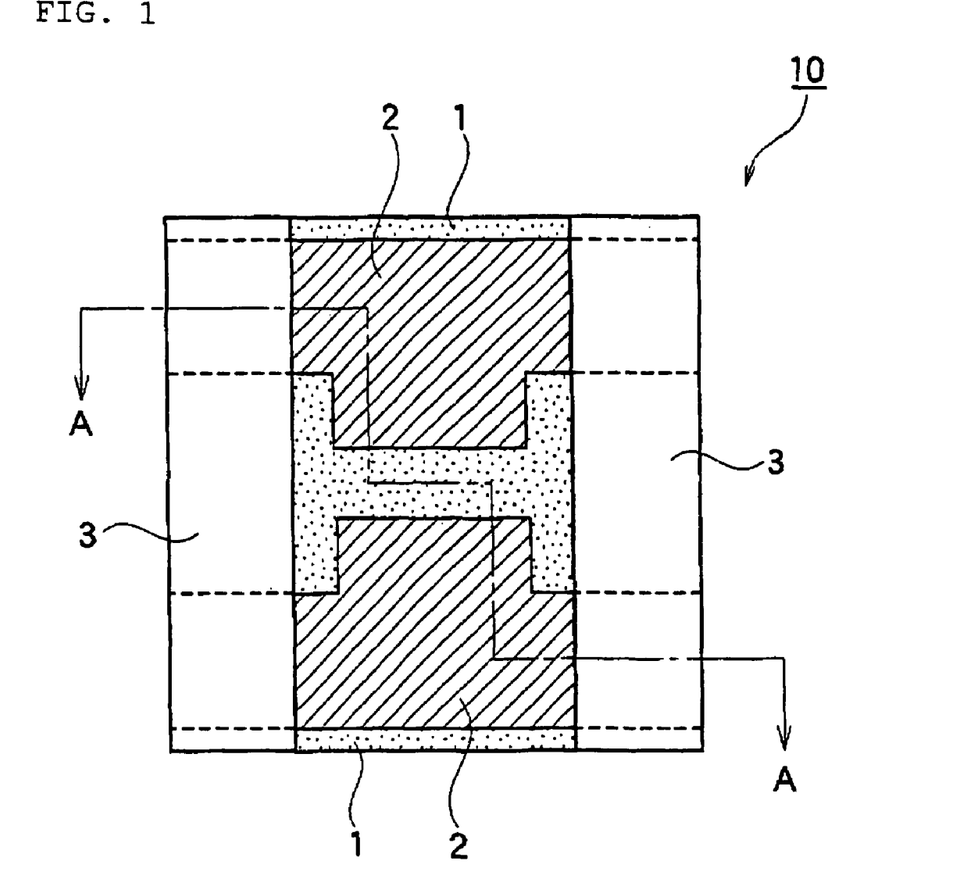
FIG. 1 is a plan view showing a typical embodiment of an element-mounting substrate of the present invention.
Figure 2:
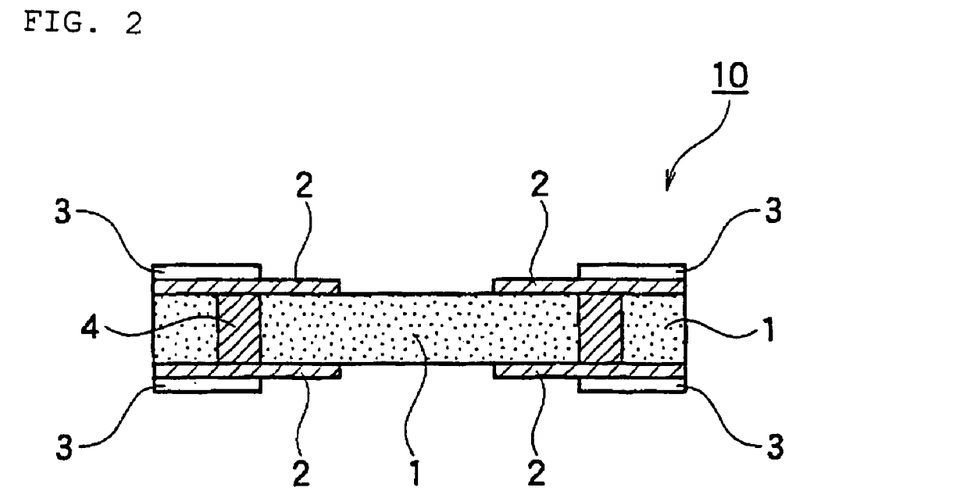
FIG. 2 is a sectional view taken on line A-A of FIG. 1.
Figure 3:
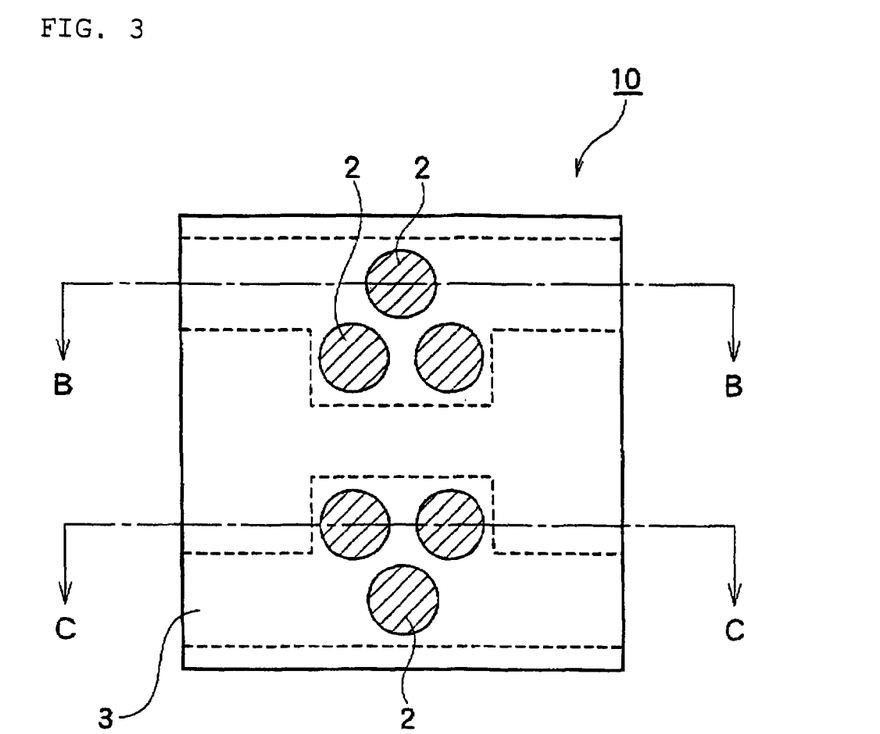
FIG. 3 is a plan view showing another embodiment of an element-mounting substrate of the present invention.
Figure 4:
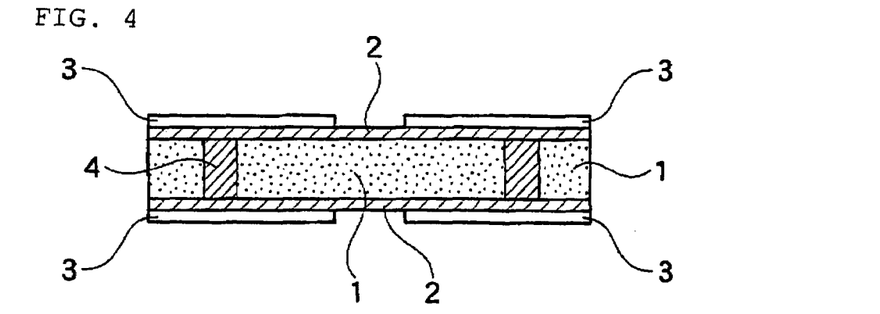
FIG. 4 is a sectional view taken on line B-B of FIG. 3.
Figure 5:
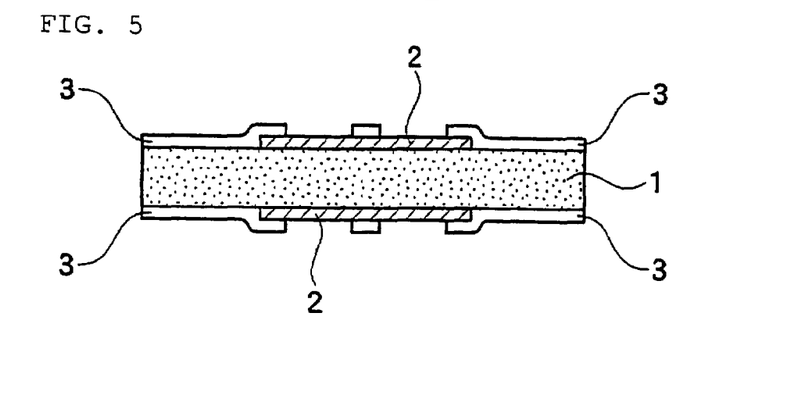
FIG. 5 is a sectional view taken on line C-C of FIG. 3.

In FIG. 1 to FIG. 5, embodiments of the element-mounting substrate of the invention are shown. FIG. 2 is a sectional view taken on line A-A of FIG. 1, FIG. 4 is a sectional view taken on line B-B of FIG. 3, and FIG. 5 is a sectional view taken on line C-C of FIG. 3.

As shown in the figures, the element-mounting substrate 10 of the invention comprises a ceramic substrate 1, an electrode layer 2 formed on the substrate and a ceramic coating layer 3 formed on a part of the electrode layer.

For the ceramic substrate 1, ceramic materials publicly known are adoptable, and for example, (i) oxide-based ceramics, such as aluminum oxide-based ceramics, silicon oxide-based ceramics, calcium oxide-based ceramics and magnesium oxide-based ceramics; (ii) nitride-based ceramics, such as aluminum nitride-based ceramics, silicon nitride-based ceramics and boron nitride ceramics; and (iii) beryllium oxide, silicon carbide, mullite and borosilicate glass are employable. The ceramic substrate is a ceramic sintering product obtained by sintering such a ceramic material. In the ceramic sintering product, various sintering assistants are sometimes contained according to the type of the ceramic used.

Of the above materials, the nitride-based ceramics, such as aluminum nitride-based ceramics, silicon nitride-based ceramics and boron nitride-based ceramics, are desirable, and the aluminum nitride-based ceramics are particularly desirable, because they have relatively high thermal conductivity and can efficiently dissipate heat generated from light emitting elements.

The ceramic substrate 1 shown in the figures has a single-layer structure in which a via hole 4 is formed to electrically connect the electrode layers 2 formed on the upper and the lower surfaces of the substrate, but the ceramic substrate for use in the invention is not limited to this structure. That is to say, the structure of the ceramic substrate is properly determined according to the desired device, and for example, a substrate in which a via hole 4 is not formed may be used, or a substrate of a multi-layer structure having a wiring pattern or a conductive layer inside the ceramic body may be used. Therefore, the thickness of the ceramic substrate 1 is not specifically restricted. However, the thickness thereof is in the range of usually 0.1 to 3 mm, preferably about 0.15 to 1 mm.

The electrode layer 2 is formed in order to connect a light emitting element mounted or a driving circuit to an electric source. Therefore, the electrode layer 2 is composed of an electrically conductive material, and in general, tungsten, molybdenum, copper, silver, gold, nickel, palladium or the like is preferably employable. In particular, tungsten or molybdenum having resistance to high temperatures in the firing is preferably employable. Although the thickness of the electrode layer 2 is not specifically restricted, it is in the range of usually 1 to 50 µm, preferably 2 to 30 µm, most preferably 5 to 15 µm. On the exposed surface of the electrode layer 2, a metal plating layer or a metal deposition layer composed of nickel, gold, palladium, rhodium, silver, aluminum or the like may be formed by electroplating or electroless plating. The pattern of the electrode layer 2 formed is variously changed according to the shape of an element to be mounted, the position of a connecting terminal, etc.

In the case where the aforesaid via hole 4 or the aforesaid inside conductive layer is formed in the ceramic substrate 1, a conductive material similar to that described above is employed. By particularly forming the electrode layer 2, the via hole 4 and the inside conductive layer from the same conductive material, electrical conduction property is stabilized.

The element-mounting substrate 10 of the invention is characterized in that the ceramic coating layer 3 is formed on a part of the electrode layer 2. The thickness of the ceramic coating layer 3 is in the range of 1 to 50 µm, preferably 3 to 20 µm, particularly preferably 5 to 15 µm.

The ceramic coating layer 3 is formed from a ceramic material similar to that of the ceramic substrate 1. The ceramic coating layer 3 is formed on a part of the electrode layer 2, and in the area other than the electrode layer 2, the ceramic coating layer 3 is sometimes directly laminated on the ceramic substrate 1, as shown in the figures. In this case, by forming the ceramic substrate 1 and the ceramic coating layer 3 from the same material to fusion bond them, the strength of the element-mounting substrate 10 can be enhanced. Therefore, when the ceramic substrate 1 is composed of, for example, aluminum nitride, it is preferable to form also the ceramic coating layer from aluminum nitride.

The ceramic coating layer 3 is formed so as to cover a part of the electrode layer 2. Consequently, at least a part of the electrode layer 2 is exposed. On this exposed portion of the electrode layer 2 on the element-mounting surface, an element such as a light emitting element is mounted. The exposed portion of the electrode layer 2 on the reverse side surface to the element-mounting surface is electrically connected to a driving circuit. The connection to the driving circuit does not necessarily have to be made on the reverse side surface and may be made on the same surface as the element-mounting surface. The driving circuit is a circuit for supplying electric power or electric signals to the light emitting element. The pattern of the ceramic coating layer 3 formed is not specifically restricted and is variously changed according to the design of the desired device. As shown in FIG. 1, the ceramic coating layer 3 may be formed so as to cover only the ends of the electrode layer 2, or as shown in FIG. 3, all the area except the element-mounting predetermined portion may be covered with the ceramic coating layer 3.

In the element-mounting substrate 10 of the invention, the ceramic coating layer 3 of a relatively small thickness is formed so as to cover a part of the electrode layer 2, as described above. Consequently, a part of the electrode layer 2 is exposed, and on this exposed portion, a solder layer can be provided. Further, when an element is mounted on the exposed portion through the solder layer or when the exposed portion is connected to a driving circuit, there is an advantage that the thickness of the ceramic coating layer 3 does not hinder the mounting operation, and because the solder does not spread out by virtue of the ceramic coating layer 3, connection (mounting) can be readily made.

The element-mounting substrate 10 of the invention is obtained by dicing a firing product of a relatively large diameter, as described later. If the electrode layer is exposed, peeling or cracking of the electrode layer is sometimes caused by an impact given in the dicing. In order to solve such a problem, it is particularly preferable to cover the electrode layer on the predetermined cutting line with the ceramic coating layer in the production process of the invention. In the element-mounting substrate obtained by this production process, the ceramic coating layer is formed so as to cover the electrode layer at the ends of the surface of the element-mounting substrate, as shown in FIG. 1 and FIG. 3, and on the side surface of the element-mounting substrate 10 exposed by the dicing, the sections of the ceramic substrate, the electrode layer and the ceramic coating layer are exposed on the same plane, as shown in FIG. 2 and FIG. 4. By covering the electrode layer on the predetermined cutting line with the ceramic coating layer and then carrying out dicing, peeling or cracking of the electrode layer due to an impact given in the dicing can be prevented.

Figure 6:
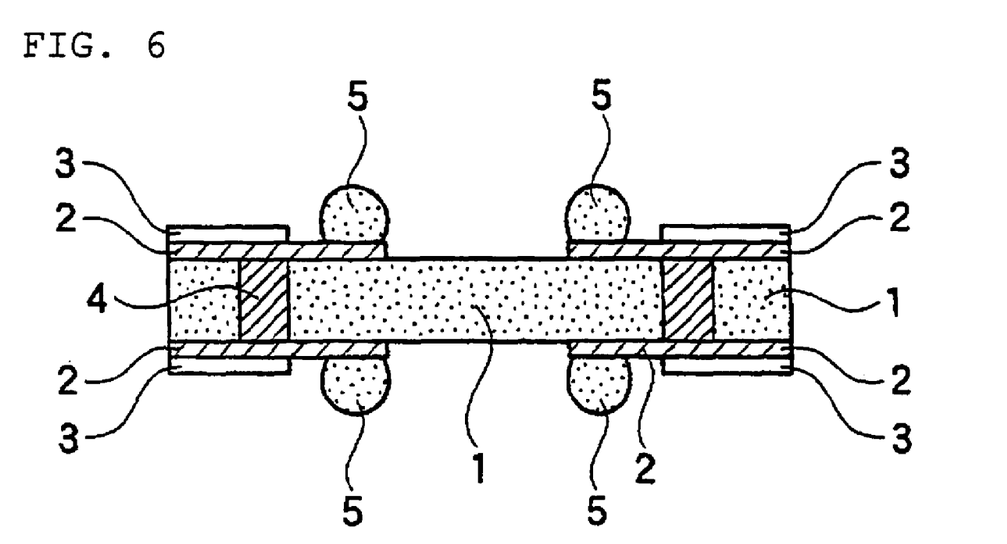
FIG. 6 is a sectional view of an element-mounting substrate having a solder layer formed thereon.

In the element-mounting substrate 10 of the invention, further, a solder layer 5 for bonding an element may be provided on the electrode layer 2 where the ceramic coating layer 3 has not been formed (see FIG. 6). In this figure, an embodiment in which a solder ball is formed as the solder layer is shown, but a solder plating film may be formed as the solder layer. The solder layer may be formed on the electrode layers on the upper and the lower surfaces, as shown in FIG. 6, or may be formed on only the electrode layer on the element-mounting surface.

Figure 7:
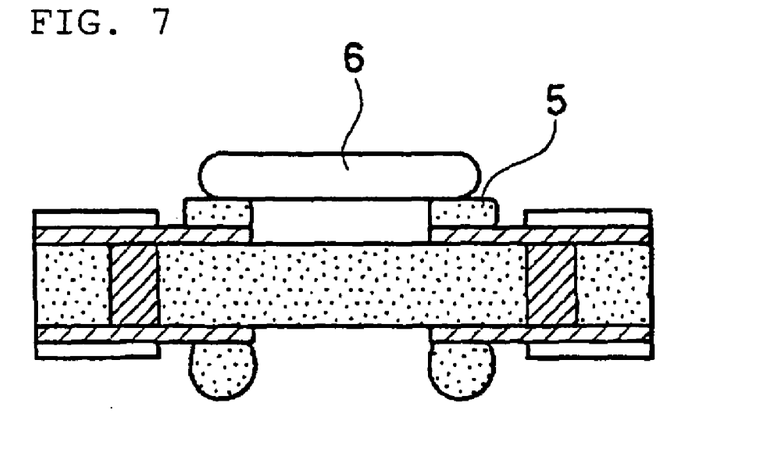
FIG. 7 is a sectional view of an element-mounting substrate on which an element has been mounted.

On the element-mounting substrate 10, an element 6 such as a light emitting element is mounted through the solder layer 5, and the element-mounting substrate 10 to be electrically connected to the element is connected to a driving circuit or the like. The element to be mounted is not limited to the light emitting element, and examples of the elements include various electronic elements, semiconductor elements and laser diode.

Especially in the case where an element that generates heat when it works, such as a light emitting element, is mounted, it is preferable to form the ceramic substrate 1 of the element-mounting substrate 10 from a material of high thermal conductivity, such as aluminum nitride.

Next, the process for producing the element-mounting substrate 10 of the invention is described. The element-mounting substrate 10 of the invention can be produced by any of a post firing process (successive firing process) and a co-firing process (simultaneous firing process). The post firing process is a process comprising forming an electrode layer and a ceramic coating layer on a large-diameter ceramic plate having been previously fired and then dicing them. On the other hand, the co-firing process is a process comprising firing a ceramic plate, an electrode layer and a ceramic coating layer at the same time and then dicing them. The ceramic plate is produced by firing a sheet of a ceramic precursor that is called a green sheet, and when the sheet is fired, dimensional shrinkage takes place. Therefore, it is preferable to adopt the post firing process in order to obtain an element-mounting substrate 10 of high dimensional accuracy. On the other hand, the co-firing process has advantages that adhesion between the ceramic plate, the electrode layer and the ceramic coating layer is enhanced and the production cost is lowered because of the simultaneous firing.

First, the post firing process is described.

In the post firing process, a ceramic plate 11 of a large diameter is prepared first. The ceramic plate 11 is produced by firing a sheet of a ceramic precursor that is called a green sheet. The green sheet is obtained by molding a mixture comprising a ceramic powder, a sintering assistant and an organic binder into a sheet. Various mixing ratios of the components and various molding methods are known, and in the present invention, the mixing ratio and the molding method are not specifically restricted.

Although the process for producing the ceramic plate 11 is not specifically restricted, an example thereof is described below. The green sheet is prepared by adding an organic solvent, such as an alcohol or toluene, an appropriate organic binder, a plasticizer such as a glycerol compound, a dispersant, etc. to a ceramic raw material powder and a sintering assistant, mixing them to give a slurry and molding the slurry into a sheet of a desired thickness by the use of sheet forming technique such as doctor blade method.

As the raw materials used for preparing the green sheet, those usually used for producing a green sheet in the field of ceramics can be used without any restriction. That is to say, as the ceramic raw material powders, ceramic powders publicly known are adoptable. For example, powders of (i) oxide-based ceramics, such as aluminum oxide-based ceramics, silicon oxide-based ceramics, calcium oxide-based ceramics and magnesium oxide-based ceramics; (ii) nitride-based ceramics, such as aluminum nitride-based ceramics, silicon nitride-based ceramics and boron nitride-based ceramics; and (iii) beryllium oxide, silicon carbide, alumina, mullite, boron nitride or borosilicate glass, are employable. From the viewpoint of thermal conductivity, powders of nitride-based ceramics such as aluminum nitride-based ceramics, silicon nitride-based ceramics and boron nitride-based ceramics are preferably employed. These ceramic powders are generally used in combination with a sintering assistant that is commonly used according to the type of the ceramic powder used.

Examples of the organic binders used include polyvinyl butyral, ethyl celluloses and acrylic resins. For the reason that moldability of the green sheet becomes excellent, poly-n-butyl methacrylate or polyvinyl butyral is particularly preferably employed.

From the viewpoint of thermal conductivity of the resulting sintered body, it is preferable to use a green sheet for nitride ceramics which is formed using as the ceramic raw material powder a nitride ceramic powder containing a sintering assistant, particularly a green sheet for aluminum nitride which is formed using as the raw material powder an aluminum nitride powder containing a sintering assistant (e.g., yttrium oxide or calcium oxide).

For forming the aforesaid via hole 4 inside the ceramic substrate 1, a hole is opened at the prescribed position of the green sheet and filled with a conductive paste in advance. The conductive paste comprises a metal powder such as tungsten or molybdenum, an organic binder, and if necessary, the same ceramic powder as that contained in the green sheet, a sintering assistant, and the like.

Plural green sheets may be laminated one upon another. For laminating the green sheets, it is preferable to contact-bond them under a pressure of about 10 KPa to 100 KPa with heating them at a temperature of about 60 to 140° C. In this case, if the conductive paste is applied in the shape of a pattern onto a surface of a green sheet and if another green sheet is laminated thereon, an inside conductive layer is also formed at the same time.

Then, the resulting green sheet is degreased and fired, whereby a ceramic plate 11 is obtained. Degreasing of the green sheet is carried out by heat-treating the green sheet in an oxidizing gas such as oxygen or air, a reducing gas such as hydrogen, an inert gas such as argon or nitrogen, a mixed gas of carbon dioxide with these gases, or a humid gas atmosphere containing water vapors. Further, the degreasing is carried out by properly selecting a temperature and a retention time from the ranges of 250 to 1200° C. and 1 minute to 1000 minutes according to the type and the amount of the organic component contained in the green sheet. As the conditions for sintering that is carried out subsequently to the degreasing treatment, those usually adopted are properly adopted according to the type of the green sheet (more specifically, the type of the ceramic powder used as the raw material). For example, when a green sheet for aluminum nitride (green sheet containing an aluminum nitride powder as a main component of inorganic components) is used, the green sheet is fired at a temperature of 1600 to 2000° C., preferably 1750 to 1850° C., for 1 to 20 hours, preferably 2 to 10 hours. As the atmosphere for the sintering, an atmosphere of a non-oxidizing gas such as a nitrogen gas is adopted, and the sintering is carried out at ordinary pressure. By carrying out sintering in the above manner, the sintering product can have a thermal conductivity of not less than 170 W/m·K, and by further restricting the conditions, it can have a thermal conductivity of not less than 200 W/m·K.

Figure 8:
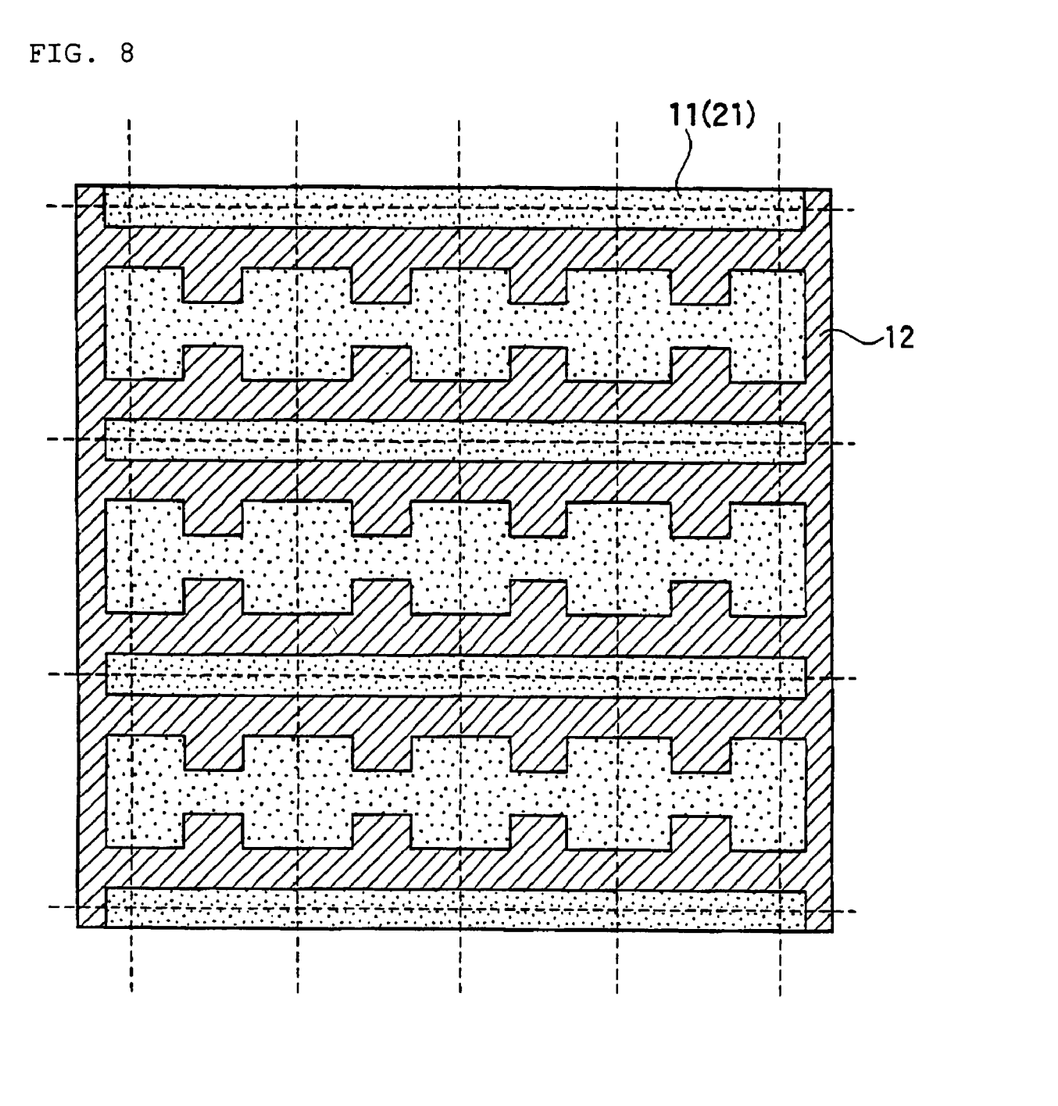
FIG. 8 is a plan view showing steps for producing an element-mounting substrate of the present invention.

In the post firing process, on the ceramic plate 11 obtained as above, an electrode precursor layer 12 is formed in the shape of a pattern, as shown in FIG. 8. The electrode precursor layer 12 is a layer that is subjected to heat treatment to form an electrode, and this layer is specifically composed of the aforesaid conductive paste (the same conductive paste as used for forming the via hole 4), preferably a tungsten paste or a molybdenum paste. Formation of the pattern of the electrode precursor layer 12 is carried out by a publicly known method such as screen printing or calender printing. Therefore, the viscosity of the conductive paste for forming the electrode precursor layer 12 is adjusted to such an extent as enables the above printing. Adjustment of the viscosity is carried out by selecting the amount or the type of the organic solvent such as terpineol or texanol or the organic binder such as ethyl cellulose.

The ceramic plate 11 on which the electrode precursor layer 12 has been formed has a plane shape shown in FIG. 8. In FIG. 8, the dotted lines are predetermined cutting lines, and along the lines, the ceramic plate 11 is divided. FIG. 8 shows an embodiment for producing 12 substrates.

Then, on a part of the electrode precursor layer 12, a ceramic coating precursor layer 13 is formed. The ceramic coating precursor layer 13 is a layer that is subjected to firing to form a ceramic coating layer 3, and this layer is formed from a paste containing a ceramic raw material powder, a sintering assistant, an organic binder and the like which are similar to those described for the green sheet. The ceramic coating precursor layer 13 is formed in the shape of a pattern so as to cover a part of the electrode precursor layer 12. Formation of the pattern is carried out by a publicly known method such as screen printing or calender printing, similarly to the electrode precursor layer 12. Therefore, the viscosity of the paste for forming the ceramic coating precursor layer 13 is adjusted to such an extent as enables the above printing. Adjustment of the viscosity is carried out by selecting the amount or the type of the organic solvent such as terpineol or texanol or the organic binder such as ethyl cellulose.

Figure 9:
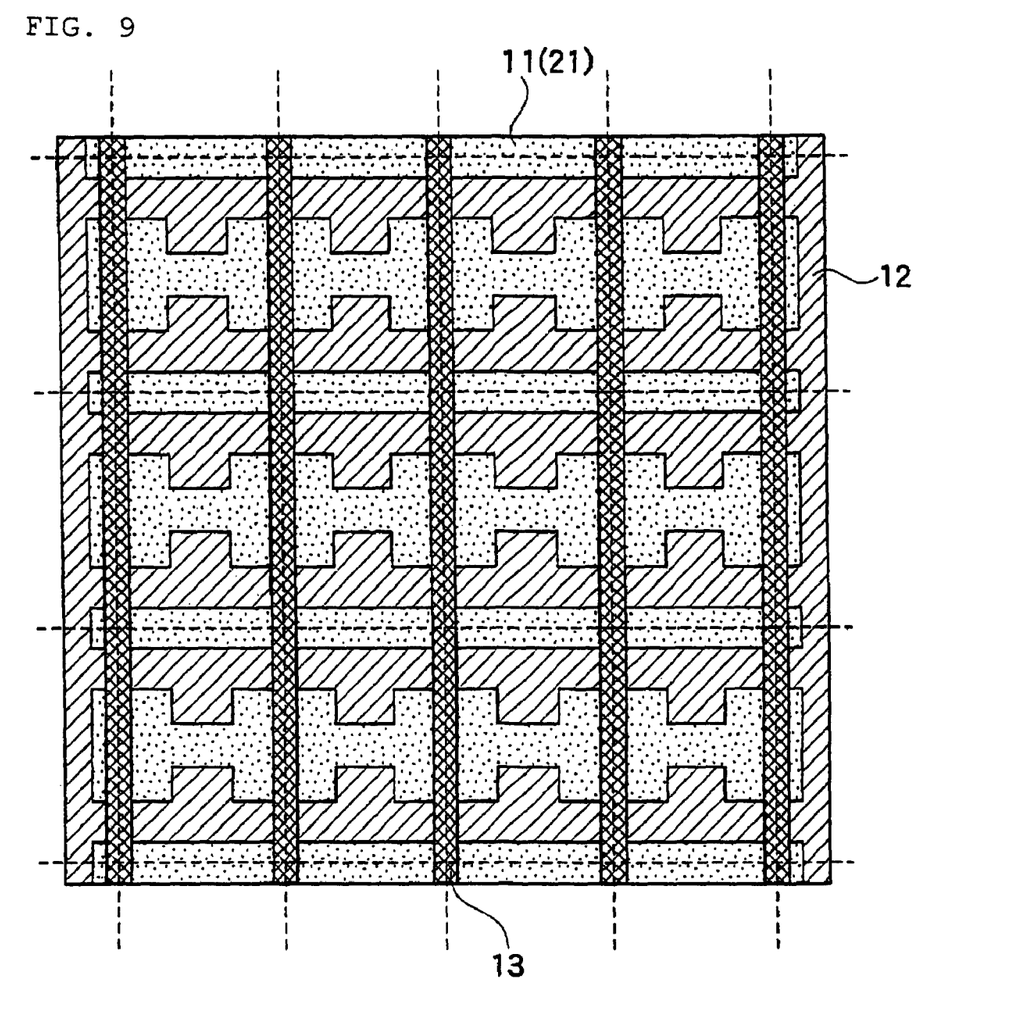
FIG. 9 is a plan view showing steps for producing an element-mounting substrate of the present invention.

The ceramic coating precursor layer 13 is formed so as to cover a part of the electrode precursor layer 12. Consequently, at least a part of the electrode layer 2 is exposed finally, and on this portion, an object such as a light emitting element is mounted. Further, the resulting product is mounted on an object such as a driving circuit. The pattern of the ceramic coating precursor layer 13 formed is not specifically restricted and is variously changed according to the design of the desired device. As shown in FIG. 9, the ceramic coating precursor layer 13 may be formed so as to cover the electrode precursor layer 12 on the predetermined cutting line, or all the area except the element-mounting predetermined portion may be covered with the ceramic coating precursor layer 13 though this is not shown in the figures.

In order to particularly prevent peeling or cracking of the electrode layer due to an impact given in the dicing after firing, it is preferable to form the ceramic coating precursor layer 13 so as to cover the electrode precursor layer 2 on the predetermined cutting line, as shown in FIG. 9.

Thereafter, the resulting precursor that is a laminate of the ceramic plate 11, the electrode precursor layer 12 and the ceramic coating precursor layer 13 is degreased when needed, and then it is fired. The conditions for the degreasing and the firing are similar to those previously described for the green sheet.

Then, the resulting firing product is diced along the predetermined cutting lines, whereby an element-mounting substrate 10 is obtained. For example, by dicing the firing product having a constitution shown in FIG. 9, an element-mounting substrate 10 shown in FIGS. 1 and 2 is obtained. Prior to the dicing, a plating layer or a solder layer may be formed on the exposed portion of the electrode layer. When all the electrode layers are formed so as to be continuous, as shown in FIG. 9, the electrode layers are electrically connected, so that the plating layer or the solder layer can be easily and simply formed by electroplating. Even if the electrodes are not electrically connected, it is easy to form a plating layer or a solder layer by electroless plating. Further, when the electrode is formed by the post firing process, the dimensional accuracy is high, so that it becomes possible to form a plating layer or a solder layer by means of vacuum deposition or sputtering by a lift off method using photolithographic technique.

Dicing is carried out by a usual dicing method using a dicing blade. In a preferred embodiment of the production process of the invention, the ceramic coating layer 3 is formed so as to cover the electrode layer 2 on the predetermined cutting line, and therefore, peeling or cracking of the electrode layer due to an impact given in the dicing can be prevented.

Next, production of the element-mounting substrate by a co-firing process is described.

In the co-firing process, the electrode precursor layer 12 and the ceramic coating precursor layer 13 are successively formed on an unfired green sheet 21, as shown in FIGS. 8 and 9, and the resulting precursor that is a laminate thereof is subjected to degreasing, firing and dicing to obtain an element-mounting substrate. Specific examples and preferred examples of the green sheet 21, the electrode precursor layer 12 and the ceramic coating precursor layer 13 are similar to those previously described. The conditions of the degreasing and the firing are also similar to those previously described for the green sheet.

EXAMPLES

The present invention is further described with reference to the following examples, but it should be construed that the invention is in no way limited to those examples.

Example 1

Post Firing Process

100 Parts by weight of a tungsten powder having a mean particle diameter of 2.5 μm, 3 parts by weight of an aluminum nitride powder having a mean particle diameter of 1.5 μm, 0.15 part by weight of a yttrium oxide powder having a mean particle diameter of 0.5 μm, 2 parts by weight of ethyl cellulose and 10 parts by weight of terpineol were kneaded to prepare a high-melting point metal paste having a viscosity at 25° C. of 3000 P. Then, 100 parts by weight of an aluminum nitride powder having a mean particle diameter of 1.5 μm, 2 parts by weight of a yttrium oxide powder having a mean particle diameter of 0.5 μm, 9 parts by weight of ethyl cellulose and 40 parts by weight of terpineol were kneaded to prepare an aluminum nitride paste having a viscosity at 25° C. of 5000 P. Then, the high-melting point metal paste was applied by printing onto a sintered aluminum nitride substrate containing 5 parts by weight of yttrium oxide to give a pattern shown in FIG. 9, followed by drying. Thereafter, the aluminum nitride paste was applied onto the pattern by printing and dried.

The substrate obtained as above was fired at 1810° C. for 4 hours in a nitrogen gas to obtain a metallized substrate. The thickness of the high-melting point metal pattern of the resulting substrate after firing was measured by a feeler type profile-measuring device, and as a result, it was 10 μm, and the thickness of the aluminum nitride coating layer formed thereon was 5 μm.

Then, Ni/Au was deposited on the metallized substrate by electrolytic process, and on a part of the substrate, 10 μm of Sn plating was provided as a solder by electrolytic process. The resulting plated substrate was cut by a dicing device using a diamond blade having a blade width of 0.1 mm under the conditions of a revolution number of 30000 rpm and a cutting feed rate of 5 mm/s. As a result of observation of the resulting cut piece, it was confirmed that peeling of the metallization portion had not occurred.

In order to confirm an effect that the solder does not run out and stays at the prescribed place to enable precise bonding, the cut piece having been subjected to solder plating and a cut piece having been subjected to no solder plating were arranged so that their metallization surfaces should be brought into contact with each other, and they were heated to 280° C. to attempt bonding of them. As a result, the cut pieces could be finely bonded to each other as expected.

Example 2

Co-Firing Process

On a surface of an aluminum nitride green sheet containing 5 parts by weight of yttrium oxide as a sintering assistant based on 100 parts by weight of an aluminum nitride powder, a high-melting point metal pattern was formed in the same manner as in Example 1, and the pattern was dried at 60° C. for 10 minutes. Then, an aluminum nitride pattern was further formed and dried at 60° C. for 10 minutes, and the resulting laminate was maintained at 900° C. for 1 hour in a hydrogen atmosphere containing moisture to perform degreasing. Thereafter, the degreased body was fired at 1800° C. for 4 hours in a nitrogen atmosphere to obtain a metallized substrate. The thickness of the high-melting point metal pattern of the resulting substrate after firing was 15 μm, and the thickness of the aluminum nitride coating layer formed thereon was 8 μm. The resulting substrate was subjected to plating in the same manner as in Example 1, and various evaluations were carried out. As a result, it was confirmed that peeling at the cut portion had not occurred. The cut piece having been subjected to solder plating and a cut piece having been subjected to no solder plating were arranged so that their metallization surfaces should be brought into contact with each other, and they were heated to 280° C. As a result, the cut pieces could be finely bonded to each other.

Comparative Example 1

A cut piece was prepared in the same manner as in Example 1, except that the aluminum nitride paste was not used, solder plating was carried out after a resist was applied by photolithography onto the area where the aluminum nitride paste was applied, then the resist was removed using acetone after the solder plating, and cutting was carried out. As a result of observation of the resulting cut piece, it was confirmed that peeling of the metallization portion had occurred. The cut piece having been subjected to solder plating and a cut piece having been subjected to no solder plating were heated to 280° C. to attempt bonding of them, but they could not be bonded. The cut piece was observed, and as a result, it was confirmed that the solder spread out to the resist coating area.

Comparative Example 2

A cut piece was prepared in the same manner as in Example 2, except that a ceramic green sheet (thickness: 0.3 mm) was used instead of the aluminum nitride paste pattern.

As a result of observation of the resulting cut piece, it was confirmed that peeling of the metallization portion had not occurred. The cut piece having been subjected to solder plating and a cut piece having been subjected to no solder plating were heated to 280° C. to attempt bonding of them, but they could not be bonded because the solder did not reach the metallization portion on the opposite side.

According to the present invention, a ceramic coating layer of a relatively small thickness is formed so as to cover a part of an electrode layer, so that a part of the electrode layer is exposed, and on this exposed portion, a solder layer can be provided. Further, when an element is mounted through the solder layer, the thickness of the ceramic coating layer did not hinder the mounting operation.

Furthermore, by forming a ceramic coating layer so as to cover the electrode layer on a predetermined cutting line, peeling or cracking of the electrode layer due to an impact given in the dicing can be prevented.

The invention claimed is:

1. A process for producing an element-mounting substrate, wherein the element-mounting substrate comprises a ceramic substrate, an electrode layer formed on the substrate and a ceramic coating layer which is formed on a part of the electrode layer and has a thickness of 1 to 50 µm, and wherein the process comprises the steps of:
   (a) forming an electrode precursor layer in the shape of a pattern of the electrode layer on a ceramic plate of a large diameter,
   (b) forming a ceramic coating precursor layer, which becomes into the same material with the ceramic substrate after firing, at once on a part of the electrode precursor layer and on a part of the ceramic substrate which is not formed by the electrode precursor layer, and
   (c) firing the resulting precursor.

2. The process as claimed in claim 1, wherein the ceramic substrate and the ceramic coating layer comprise aluminum nitride.

3. The process as claimed in claim 2, which further comprises the step of foaming a solder layer on the electrode layer on which the ceramic coating layer is not formed, according to the fired body obtained in the step (c).

4. The process as claimed in claim 1, which further comprises the step of foaming a solder layer on the electrode layer on which the ceramic coating layer is not formed, according to the fired body obtained in the step (c).

5. The process as claimed in claim 4, wherein the ceramic coating precursor layer is formed so as to cover the electrode precursor layer on a predetermined cutting line of a laminate and the process further comprises the step of separating the fired body by cutting along with the predetermined cutting line.

6. The process as claimed in claim 1, wherein the ceramic coating precursor layer is formed so as to cover the electrode precursor layer on a predetermined cutting line of a laminate and the process further comprises the step of separating the fired body by cutting along with the predetermined cutting line.

7. The process as claimed in claim 2, wherein the ceramic coating precursor layer is formed so as to cover the electrode precursor layer on a predetermined cutting line of a laminate and the process further comprises the step of separating the fired body by cutting along with the predetermined cutting line.

* * * * *